(12) United States Patent
Noh et al.

(10) Patent No.: US 11,824,043 B2
(45) Date of Patent: Nov. 21, 2023

(54) SEMICONDUCTOR PACKAGE

(71) Applicant: SAMSUNG ELECTRONICS CO., LTD., Suwon-si (KR)

(72) Inventors: Hyunjun Noh, Cheonan-si (KR); Keunho Choi, Asan-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 212 days.

(21) Appl. No.: 17/188,179

(22) Filed: Mar. 1, 2021

(65) Prior Publication Data
US 2022/0020727 A1 Jan. 20, 2022

(30) Foreign Application Priority Data

Jul. 16, 2020 (KR) ........................ 10-2020-0088028

(51) Int. Cl.
*H01L 25/065* (2023.01)
*H01L 23/31* (2006.01)
*H01L 23/00* (2006.01)

(52) U.S. Cl.
CPC ...... *H01L 25/0657* (2013.01); *H01L 23/3128* (2013.01); *H01L 24/06* (2013.01); *H01L 24/32* (2013.01); *H01L 2224/06135* (2013.01); *H01L 2224/32225* (2013.01); *H01L 2225/0651* (2013.01); *H01L 2225/06506* (2013.01); *H01L 2225/06562* (2013.01)

(58) Field of Classification Search
CPC ............................................ H01L 2225/06562
See application file for complete search history.

(56) References Cited

U.S. PATENT DOCUMENTS

| | | | |
|---|---|---|---|
| 6,825,572 B2 | 11/2004 | Tian et al. | |
| 7,518,250 B2 | 4/2009 | Shimanuki | |
| 7,750,453 B2 | 7/2010 | Kim et al. | |
| 9,087,816 B2 | 7/2015 | Kuroda et al. | |
| 2004/0163843 A1 | 8/2004 | Shin et al. | |
| 2010/0219521 A1 | 9/2010 | Lee et al. | |
| 2020/0118965 A1 | 4/2020 | Enomoto | |
| 2022/0005779 A1* | 1/2022 | Niwa | ................ H01L 21/6836 |

FOREIGN PATENT DOCUMENTS

| | | |
|---|---|---|
| KR | 10-0406448 | 11/2003 |
| KR | 10-2004-0075629 | 8/2004 |
| KR | 10-2006-0017294 | 2/2006 |

* cited by examiner

*Primary Examiner* — Yu-Hsi D Sun
(74) *Attorney, Agent, or Firm* — F. CHAU & ASSOCIATES, LLC

(57) ABSTRACT

A semiconductor package includes a base substrate, an insulating layer including a first region disposed on the base substrate and in which first and second openings are disposed and a second region, a remaining region of the base substrate other than the first region, a first semiconductor chip disposed on the base substrate and including bonding pads disposed closely to a first edge, at least one second semiconductor chip stacked on the first semiconductor chip in the form of a staircase toward a second edge, parallel to the first edge, and a molding portion covering the base substrate to encapsulate the first and second semiconductor chips, wherein the length of the first edge is disposed to overlap the second region, both ends of the second edge are disposed to overlap the first and second openings, and the molding portion fills the first and second openings.

18 Claims, 9 Drawing Sheets

# SEMICONDUCTOR PACKAGE

CROSS-REFERENCE TO RELATED APPLICATION(S)

This application claims priority under 35 U.S.C. § 119 to Korean Patent Application No. 10-2020-0088028, filed on Jul. 16, 2020, in the Korean Intellectual Property Office, the disclosure of which is incorporated by reference herein.

TECHNICAL FIELD

The present disclosure relates to a semiconductor package. More particularly, the present disclosure relates to a semiconductor package with increased reliability.

DISCUSSION OF RELATED ART

In the electronics industry, there is growing demand for increasingly high-performance, high-speed, and compact electronic components. These electronic components may be implemented in the form of semiconductor packages and semiconductor chips, which may be disposed on a substrate such as a printed circuit board.

Semiconductor packaging technologies may include semiconductor chips stacked and mounted on a single semiconductor substrate, or packages stacked on packages. As stacked semiconductor chips are becoming slimmer, however, warpage occurring on the semiconductor chips is increasing. Warpage in semiconductor packaging employing a slimmed semiconductor chip may reduce reliability of the semiconductor chip.

SUMMARY

The present disclosure relates to a semiconductor package having increased reliability.

According to an example embodiment, a semiconductor package includes a base substrate, an insulating layer including a first region disposed on the base substrate and in which first and second openings are disposed and a second region, the remaining region of the base substrate, other than the first region, a first semiconductor chip disposed on the base substrate and including bonding pads disposed closely to a first edge, at least one second semiconductor chip stacked on the first semiconductor chip in the form of a staircase toward a second edge, parallel to the first edge, and a molding portion covering the base substrate to encapsulate the first and second semiconductor chips, wherein the length of the first edge is disposed to overlap the second region, both ends of the second edge are disposed to overlap the first and second openings, and the molding portion fills the first and second openings.

According to an example embodiment, a semiconductor package includes a package substrate comprising one surface in which an insulating layer is disposed, the insulating layer comprising openings, at least one first semiconductor chip including a first surface in contact with the one surface of the package substrate and a second surface opposing the first surface and comprising bonding pads closely disposed on one edge thereof, the first surface including first and second corners disposed at both ends of the one edge and third and fourth corners disposed on both ends of the other edge, parallel to the one edge, and at least one second semiconductor chip formed on the second surface in the form of a staircase, wherein the insulating layer includes a first region including the openings and a second region, the remaining region of the base substrate, other than the first region, and the first and second corners overlap the second region, and the third and fourth corners overlap the first region.

According to an example embodiment, a semiconductor package includes a package substrate including one surface in which an insulating layer is disposed, the insulating layer including first and second openings, and at least one semiconductor chip stack including a plurality of semiconductor chips stacked on the one surface of the package substrate in the form of a staircase, wherein a plurality of the semiconductor chips includes a first semiconductor chip comprising a tetragonal mounting region defined by first and second edges opposing each other and third and fourth edges connecting the first and second edges and a plurality of bonding pads disposed closely to the first edge, and at least one second semiconductor chip stacked on the first semiconductor chip in the form of a staircase, wherein both ends of the second edges overlap the first and second openings.

BRIEF DESCRIPTION OF DRAWINGS

The above and other aspects, features and advantages will be more clearly understood from the following detailed description of example embodiments, with reference to the accompanying drawings, in which.

DETAILED DESCRIPTION

Hereinafter, various example embodiments will be described in detail with reference to the accompanying drawings.

Figure 1:
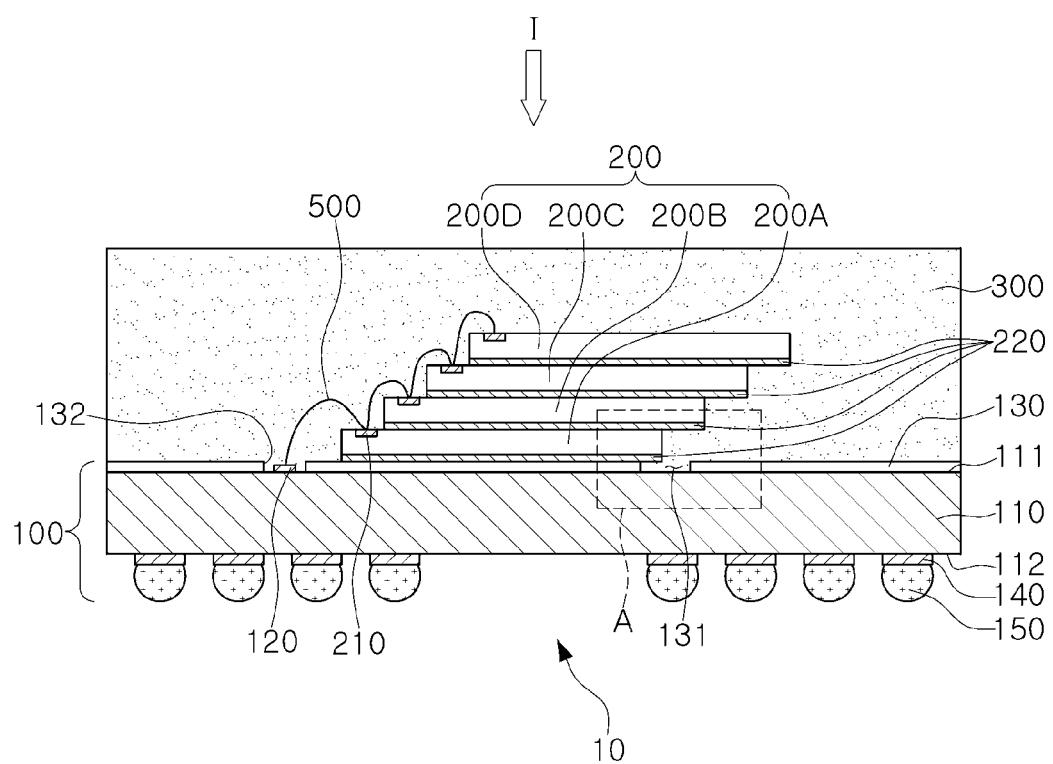
FIG. 1 is a side cross-sectional view of a semiconductor package according to an example embodiment of the present disclosure.
Figure 2:
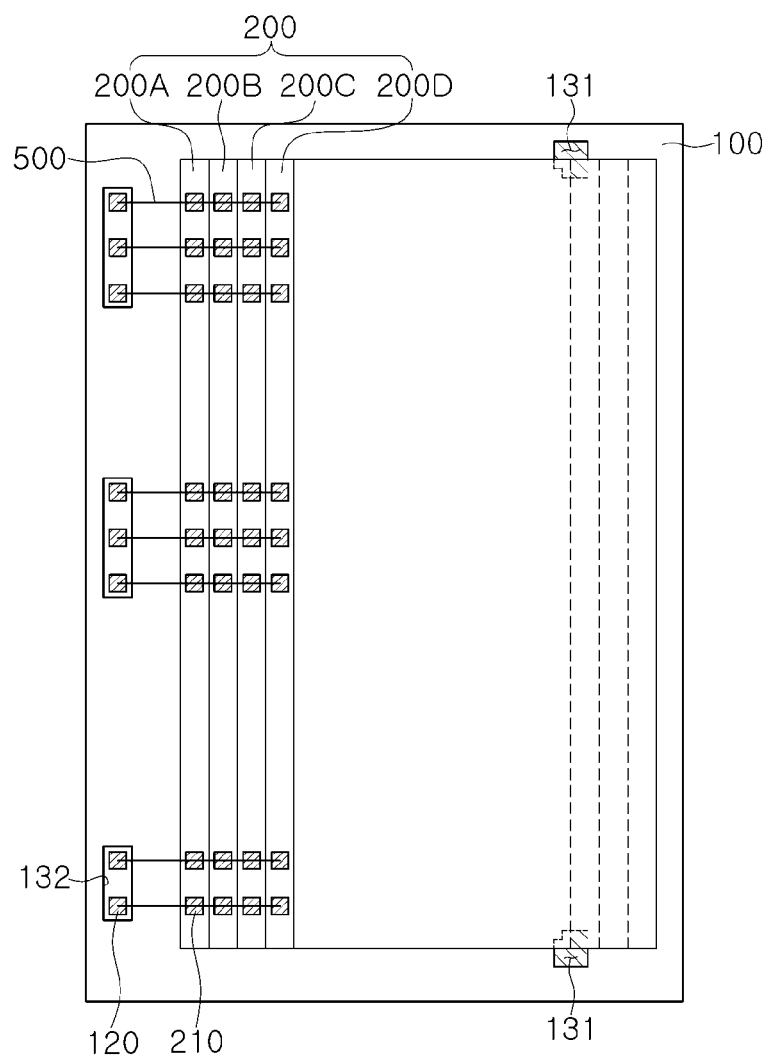
FIG. 2 is a planar view of FIG. 1 in an I direction.
Figure 3:
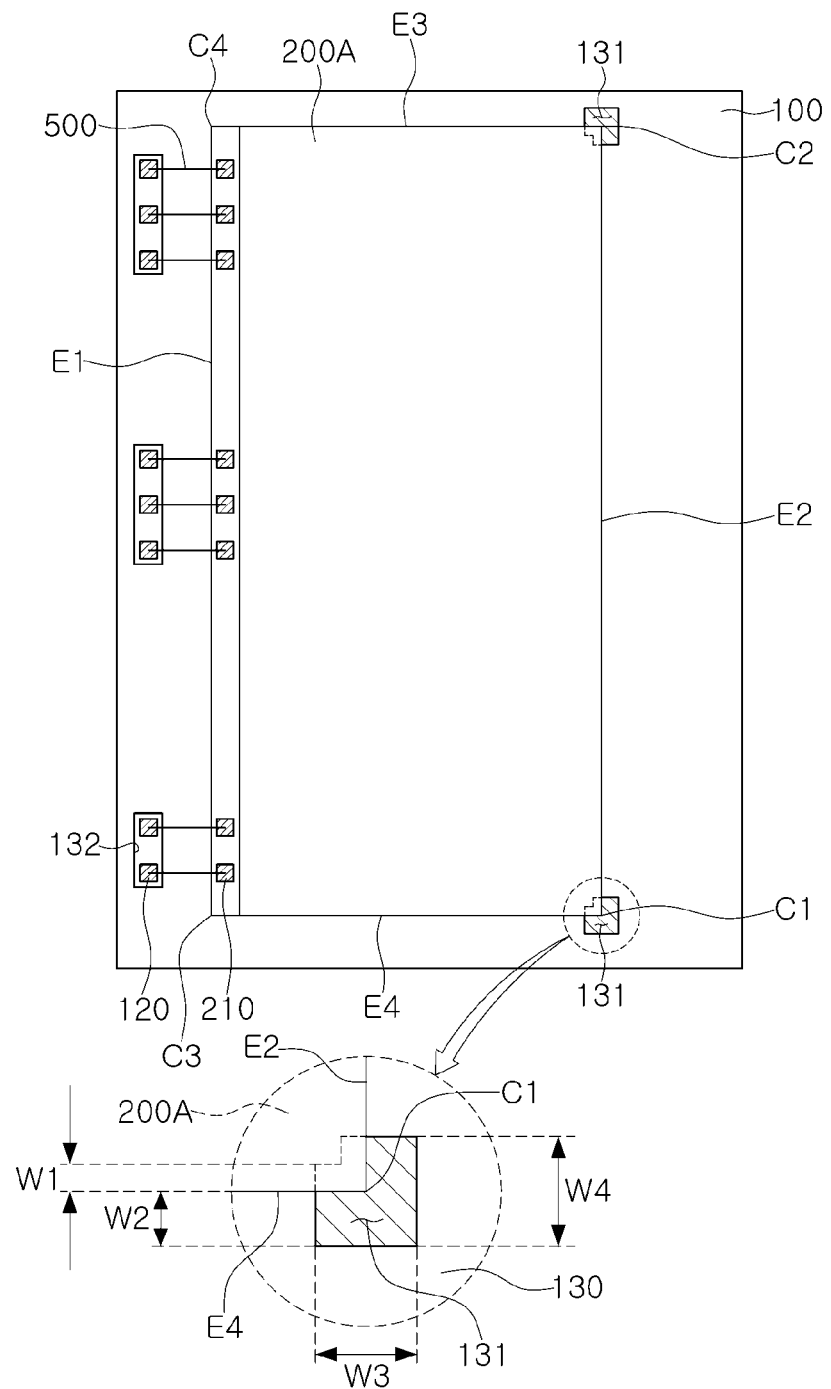
FIG. 3 is a planar view of the semiconductor package of FIG. 2 having a second semiconductor chip removed.
Figure 4:
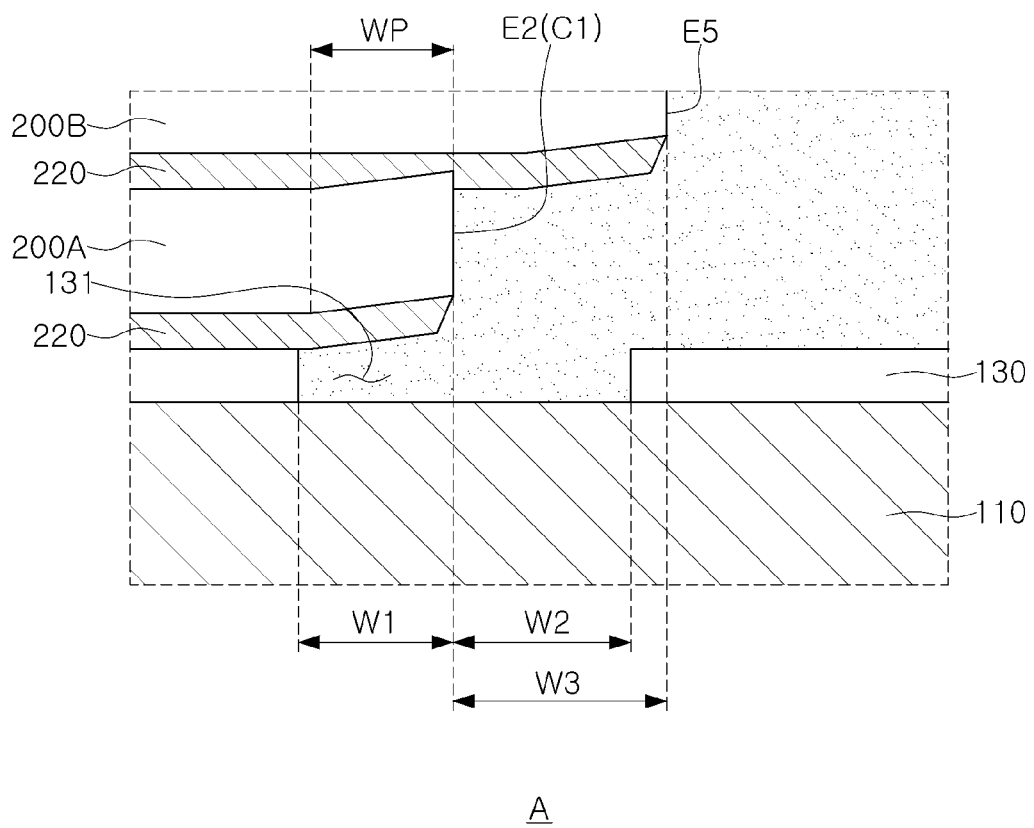
FIG. 4 is an enlarged view of section "A" of FIG. 1.

FIGS. 1 to 4 illustrate example embodiments of a semiconductor package. FIG. 1 is a side cross-sectional view of a semiconductor package according to an example embodiment, and FIG. 2 is a planar view of FIG. 1 in an I direction. FIG. 3 is a planar view of the semiconductor package of FIG. 2 having a second semiconductor chip removed, and FIG. 4 is an enlarged view of section "A" of FIG. 1.

Referring to FIG. 1, a semiconductor package 10 according to an example embodiment includes a package substrate 100, a semiconductor chip stack 200 formed on the package substrate 100, and a molding portion 300 covering the semiconductor chip stack 200. The semiconductor package 10 according to an example embodiment may have a fine ball grid array (FBGA) type.

The package substrate 100 may include a base substrate 110, a circuit pattern, and an insulating layer 130. In the case of an example embodiment, the base substrate 110 may be a single layer or multilayer printed circuit board.

The base substrate 110 includes a first surface 111 and a second surface 112 and may include an insulating material. Ball lands 140 may be disposed on the second surface 112 of the base substrate 110 as external connection terminals, and a bump 150 may be attached to each ball land 140. The semiconductor chip stack 200 may be connected to a connection pad 120 of the package substrate 100 through a wire 500.

The circuit pattern is disposed on the first surface 111 of the base substrate 110 and may be formed of a highly conductive metal material, such as copper (Cu). One region of the circuit pattern may form the connection pads 120 to which the wire 500 is bonded.

The insulating layer 130 may be disposed to substantially cover the first surface 111 of the base substrate 110. The insulating layer 130 may be a resin layer, and may be a solder resist layer in an example embodiment. The insulating layer 130 may include openings 131 through which the base substrate 110 or the circuit pattern is exposed. The openings 131 may prevent a void from being formed in a lower portion of the semiconductor chip stack 200 by allowing a resin solution to penetrate between the package substrate 100 and the semiconductor chip stack 200 during manufacturing of the molding portion 300. This will be described below in detail. Alternately, according to an example embodiment, the insulating layer 130 may include openings 132 through which the connection pads 120 are exposed.

The semiconductor chip stack 200 may have a structure in which a plurality of semiconductor chips 200A to 200D are stacked in the form of a staircase. In an example embodiment, the plurality of the semiconductor chips 200A to 200D forming the semiconductor chip stack 200 may be same-type memory chips and may be memory chips having the same capacity. The memory chip may be a phase change random access memory (PRAM), a resistive random access memory (RRAM), a magnetic random access memory (MRAM), a dynamic random access memory (DRAM), a flash memory, or the like. A plurality of the semiconductor chips 200A to 200D may be stacked on the package substrate 100 in the form of a staircase and may be adhered and fixed to each other by one or more adhesive layers 220. Further, the lowermost semiconductor chip 200A, among a plurality of the semiconductor chips 200A to 200D, may be adhered and fixed to the package substrate 100 by the adhesive layer 220. In an example embodiment, the adhesive layer 220 may be a die attach film.

FIG. 1 illustrates an example embodiment in which a single semiconductor chip stack 200 is disposed on the package substrate 100, but the present disclosure is not necessarily limited thereto. Two or more semiconductor chip stacked bodies may be disposed on the package substrate 100 according to example embodiments.

The bonding pads 210 of a plurality of the semiconductor chips 200A to 200D forming the semiconductor chip stack 200 may be bonded to the connection pads 120 through the wire 500. FIG. 1 illustrates an example embodiment in which the semiconductor chip stack 200 is formed of four stacked semiconductor chips 200A to 200D, but the present disclosure is not necessarily limited thereto. For example, two or more stacked semiconductor chips may be sufficient. With reference to FIG. 1, the lowermost semiconductor chip 200A in the plurality of the semiconductor chips 200A to 200D and in contact with the package substrate 100 is defined as a first semiconductor chip, and the semiconductor chips 200B to 200D disposed on the first semiconductor chip 200A are defined as second semiconductor chips, and each will be described with further detail below.

Referring to FIGS. 2 and 3, the first and second semiconductor chips 200A to 200D may have a tetragonal shape having first to fourth sides E1 to E4. The bonding pads 210, to which the wire 500 is bonded, are adjacent to the first edge E1 and may form a row. The first and second edges E1 and E2 are parallel to each other, and the third and fourth edges E3 and E4 may connect the first and second edges E1 and E2. A case in which both ends of the second edge E2 are defined as first and second corners C1 and C2 and those of the first edge E1 are defined as third and fourth corners C3 and C4 will be described hereinafter.

Each of the first and second semiconductor chips 200A to 200D forming the semiconductor chip stack 200 has planar upper and lower surfaces, and may have a hexahedron shape. However, due to thermal expansion of the semiconductor materials, the first and second semiconductor chips 200A to 200D may have warpage under different temperature conditions. In this regard, manufacturing processes may be controlled such that the semiconductor chips forming the semiconductor chip stack 200 warp in a same direction to secure durability of the semiconductor chip stack 200. In an example, the first and second semiconductor chips 200A to 200D having first to fourth corners C1 to C4 may warp upwardly away from the substrate 100. This type of warpage may be referred to as "smile-typed" warpage. In an example embodiment, this warpage in the first and second semiconductor chips 200A to 200D may have a width that is equivalent to 1.25% or less that of a length of one edge of the first and second semiconductor chips 200A to 200D.

The molding portion 300 may entirely cover the package substrate 100 to encapsulate the semiconductor chip stack 200. The molding portion 300 may be formed by molding an insulating resin. In an example embodiment, the molding portion 300 may include a material containing an epoxy molding compound (EMC).

The molding portion 300 may be formed by disposing the package substrate 100 on which the semiconductor chip stack 200 is mounted in a mold through a transfer molding method involving pressing a resin solution in the mold. However, lifting movement may occur between the package substrate 100 and the semiconductor chip stack 200 due to pressure from the resin solution on the semiconductor chip stack 200, thereby causing a void to form. In an example embodiment, the openings 131 are disposed on the insulating layers 130 and filled with the resin solution, thereby preventing lifting from occurring between the package substrate 100 and the semiconductor chip stack 200.

Figure 6:
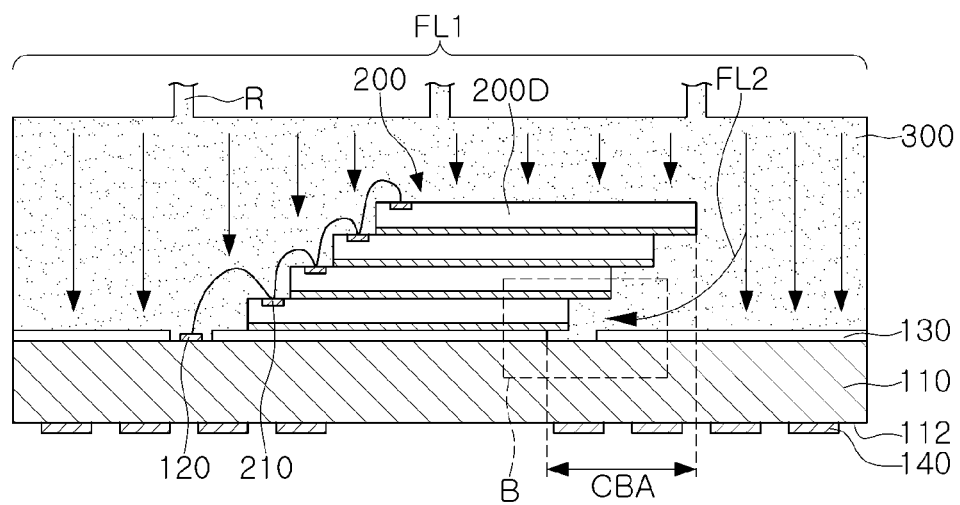
FIGS. 6 and 7 are diagrams illustrating a cracking prevention effect of a semiconductor package according to an example embodiment.
Figure 7:
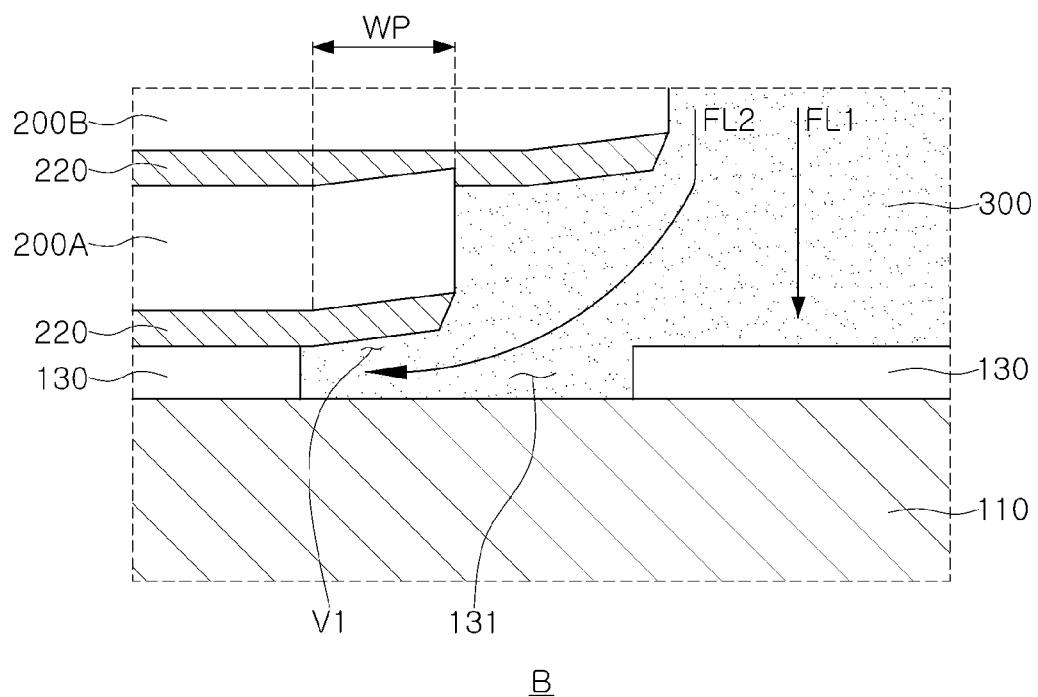

This will be described in detail based on FIGS. 6 to 8. FIGS. 6 and 7 are diagrams illustrating a cracking prevention effect of a semiconductor package according to an example embodiment, and FIG. 8 is a diagram illustrating a comparative example.

Referring to FIG. 6, a resin solution R pressed in to form a molding portion 300 of a semiconductor package 10 flows in a first direction FL1 in which pressure is applied to a surface of a package substrate 100 and a semiconductor chip stack 200. The flow of the resin solution R flowing in the first direction FL1 is blocked by a second semiconductor chip 200D in a lower portion CBA of the second semiconductor chip 200D. Accordingly, the resin solution R changes to flow in a second direction FL2 toward a side surface of the semiconductor chip stack 200 in the lower portion CBA of the second semiconductor chip 200D. The first to fourth corners of the first semiconductor chip 200A disposed at a lowermost portion of the semiconductor chip stack 200 may be vulnerable to pressure applied on a side surface due to warpage. Accordingly, the resin solution R flowing in the second direction FL2 may penetrate into the region where the first semiconductor chip 20A and the package substrate 100 contact each other.

Figure 8:
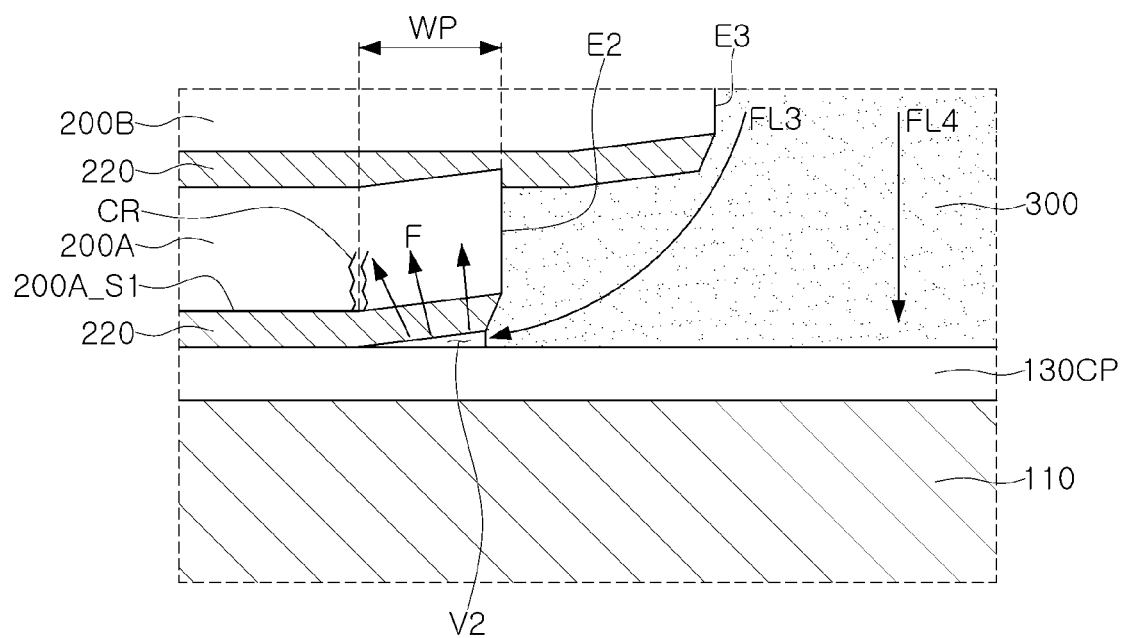
FIG. 8 is a diagram illustrating a comparative example.

FIG. 8 is a comparative example in which no openings are disposed in an insulating layer 130CP. A pressed-in resin solution flows in a fourth direction FL4 such that a surface of the insulating layer 130CP is pressed. Due to a flow of a resin solution in a third direction FL3 that applies pressure to a warped region WP of the first semiconductor chip 200A, the first semiconductor chip 200A applies force F to the warped region WP to cause lifting between the first semiconductor chip 200A and the package substrate 100. As a result, a void V2 is formed between the first semiconductor chip 200A and the package substrate 100. The void V2 formed by lifting the first semiconductor chip 200A is formed to have a wedge shape having a decreasing thickness, thereby disabling the resin solution penetrating into the void V2 to fill the void V2. Accordingly, the void V2 may still be present in the lower portion of the first semiconductor chip 200A even after a molding process. Such a void V2 repeatedly contracts and expands during manufacturing of the semiconductor package 10 to cause cracking CR on a upper surface 200A_S1 of the first semiconductor chip 200A.

FIG. 7 illustrates a semiconductor package 10 according to an example embodiment and shows that a resin solution flows into openings 131 formed in the insulating layer 130 to fill the void V1. In contrast to the void V2 of the comparative example described above, formed to have a wedge shape and making the resin solution difficult to be filled, the void V1 of an example embodiment may be easily filled with a resin solution due to the openings 131. Accordingly, in an example embodiment, cracking may be effectively prevented from being formed in the lower portion of the first semiconductor chip 200A.

The openings 131 of the insulating layer 130 will be described in detail with reference to FIG. 3. FIG. 3 illustrates an example wherein only the first semiconductor chip 200A is disposed on the package substrate 100 by removing the second semiconductor chips 200B to 200D from the semiconductor chip stack 200.

Referring to FIG. 3, the openings 131 of the insulating layer 130 may be limitedly disposed in the first and second corners C1 and C2, among the first to fourth corners C1 to C4 of the first semiconductor chip 200A. During the formation of the molding portion 300, the third and fourth corners C3 and C4 of the first semiconductor chip 200A are directly pressed by the inflow of resin solution. Accordingly, when openings are disposed in the lower portion of the third and fourth corners C3 and C4, there is no portion of insulating layer 130 supporting the lower portion of the first semiconductor chip 200A near to corners C3 and C4, thereby potentially causing cracking on the first semiconductor chip 200A during the formation of the molding portion 300. Accordingly, in an example embodiment, the openings 131 are limitedly disposed in a lower portion of the first and second corners C1 and C2, which are not directly pressed by the resin solution, such that cracking can be effectively prevented from being formed in the first semiconductor chip 200A.

Figure 5A:
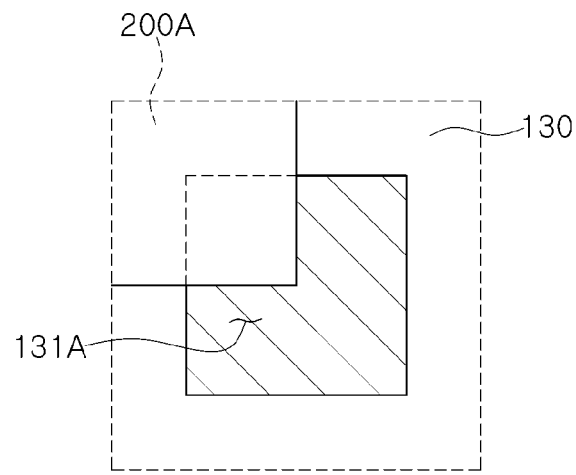
FIGS. 5A to 5C are planar views illustrating variously shaped openings employable in a semiconductor package according to an example embodiment.
Figure 5B:
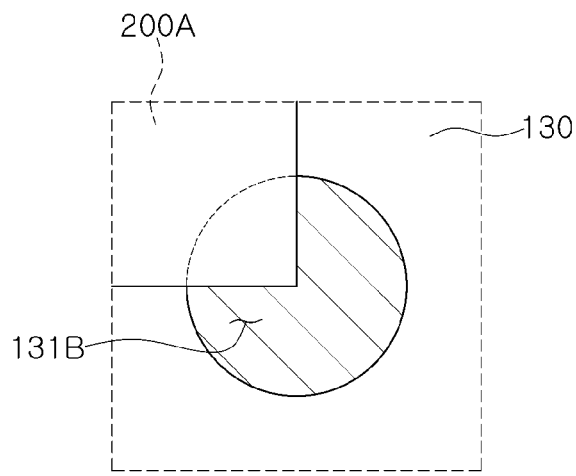
Figure 5C:
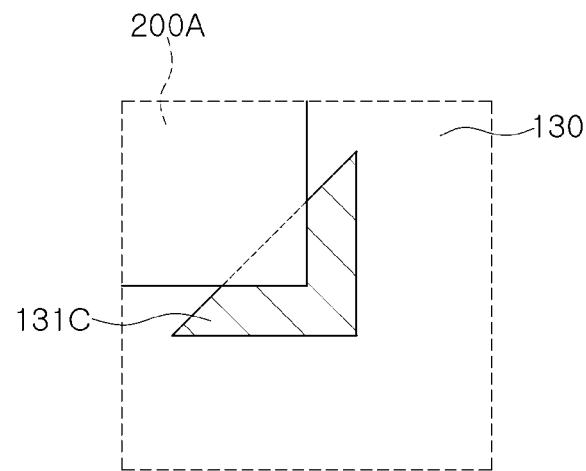

The openings 131 may have a predetermined width along edges in contact with the first and second corners C1 and C2. For example, the opening 131 disposed in a lower portion of the first corner C1 may have a predetermined width along second and fourth edges E2 and E4. Regions W3 and W4 of the openings 131 may have an area larger than an area in which warpage has occurred in the first semiconductor chip 200A. A shape of the openings 131 may be subject to various modifications as long as this condition is fulfilled. As illustrated in FIG. 3, the openings 131 may have a tetragonal shape wherein a corner of the shape facing towards the first semiconductor chip 200A is removed. Alternately, the openings 131 may be modified to tetragonal openings 131A, circular openings 131B, and triangular openings as illustrated in FIGS. 5A to 5C. Further, the openings 131 may have the same shape and may be disposed symmetrically at both sides of the second edge E2 of the first semiconductor chip 200A.

Referring to FIG. 4, the openings 131 may be disposed to have a width of 10 µm to 40 µm on the second edge E2 of the first semiconductor chip 200A toward an inside of the first semiconductor chip 200A. Additionally or alternatively, the openings 131 may be disposed within a range such that a region W2 not overlapping with the first semiconductor chip 200A does not extend into a region W3 corresponding to a side surface E5 of the second semiconductor chip 200B. Specifically, the region W2 not overlapping with the first semiconductor chip 200A may be disposed to have a width of 10 µm to 400 µm on the second edge E2 of the first semiconductor chip 200A toward an outside of the first semiconductor chip 200A.

In the case in which a width of a region W1 overlapping with the first semiconductor chip 200A is less than 10 µm, a space for the openings 131 is excessively reduced, and there may not be sufficient space filled by the resin solution. In contrast, in the case in which the width exceeds 40 µm, the space for the openings excessively increases, and a region may form such that the resin solution cannot fill it, thereby forming a void. Further, in the case in which a width of the second region W2 not overlapping with the first semiconductor chip 200A is less than 10 µm, a space for the openings 131 is excessively reduced, and there may not be sufficient space filled by the resin solution. In contrast, in the case in which the width W2 exceeds 400 µm, the openings 131 excessively increase in size and may be directly affected by the Dow of the resin solution flowing in the first direction FL1, thereby generating cracking on the first semiconductor chip 200A.

Figure 9:
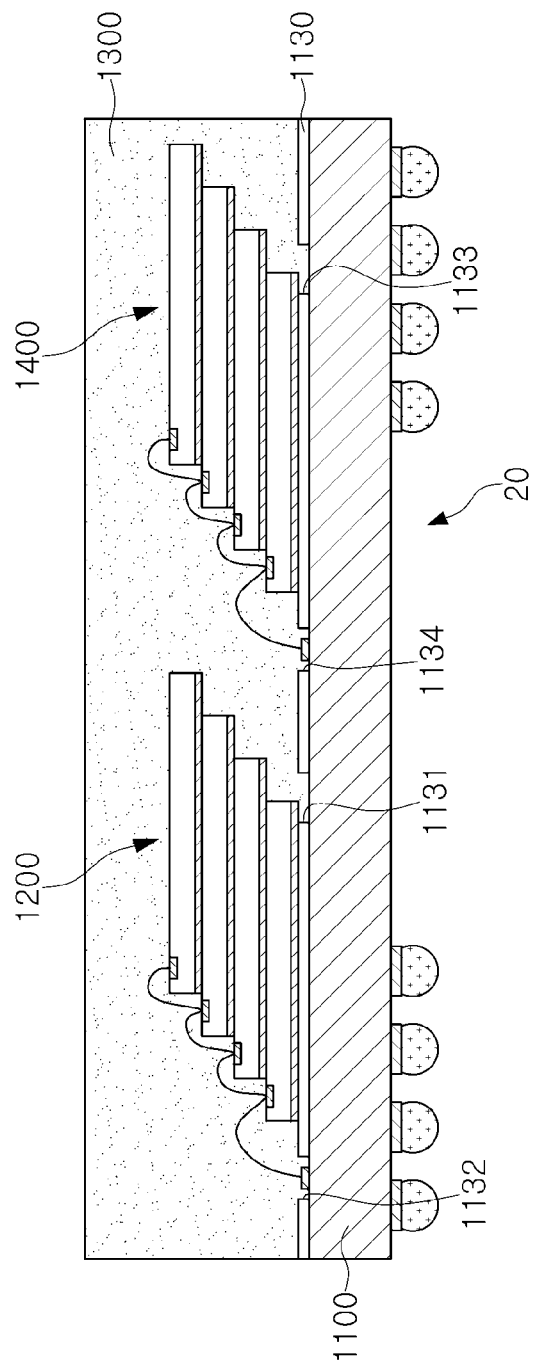
FIG. 9 is a side cross-sectional view schematically illustrating a semiconductor package according to an example embodiment.

FIG. 9 is a side cross-sectional view schematically illustrating a semiconductor package according to an example embodiment. When compared to the previously described example embodiment, a semiconductor package 20 of FIG. 9 is different in that first and second semiconductor chip stacks 1200 and 1400 are disposed on a package substrate 1100. However, the semiconductor package 20 of FIG. 9 is the same in that openings 1131 to 1134 are disposed on an insulating layer 1130, and a molding portion 1300 is filled in the openings 1311 and 1133 and in contact with the first and second semiconductor chip stacked bodies 1200 and 1400, and thus, detailed descriptions thereof will be omitted to avoid repeated description.

As set forth above, according to example embodiments, a semiconductor package is configured to form openings, in which a molding portion is filled, in a lower portion of a semiconductor chip to prevent formation of a void in the lower portion of the semiconductor chip during a manufacturing process of the molding portion.

Various advantages and beneficial effects of the present disclosure are not limited to the foregoing, and it will be readily understood in the course of describing the specific embodiments of the present disclosure.

While example embodiments have been shown and described above, it will be apparent to those skilled in the art that modifications and variations may be made without departing from the scope of the present disclosure, as defined by the appended claims.

What is claimed is:

1. A semiconductor package, comprising:
a base substrate comprising a connection pad on an upper surface of the base substrate;
an insulating layer comprising a first region disposed on the base substrate in which first and second openings are disposed, and a second region, the remaining region of the base substrate, other than the first region;
an adhesive disposed on the insulating layer;
a first semiconductor chip disposed on the adhesive and wire-bonded to the connection pad and comprising bonding pads disposed along a first edge of the first semiconductor chip;
at least one second semiconductor chip stacked on the first semiconductor chip, wherein the at least one second semiconductor chip is stacked offset from the first semiconductor chip toward a second edge opposite the first edge in a first horizontal direction to form a staircase shape; and
a molding portion covering the base substrate, wherein the molding portion encapsulates the first and second semiconductor chips,
wherein the first edge overlaps the second region, wherein the second edge includes a first corner and a second corner, wherein the first corner and the second corner are each disposed to partially overlap the first and second openings in a vertical direction, respectively, wherein the molding portion fills the first and second openings, and
wherein a lower surface of the adhesive is in contact with an upper surface of the insulating layer and an upper surface of the adhesive is in contact with a lower surface of the first semiconductor chip.

2. The semiconductor package of claim 1, wherein the first and second openings each comprise a third region and a fourth region, wherein the third region of each opening is the region that overlaps the first semiconductor chip in the vertical direction, and wherein the fourth region is a remaining region other than the third region.

3. The semiconductor package of claim 2, wherein the third region of each opening has a width of 10 μm to 40 μm from the second edge of the first semiconductor chip toward an inside of the first semiconductor chip, and
wherein the fourth region of each opening has a width of 10 μm to 400 μm from the second edge of the first semiconductor chip toward an outside of the first semiconductor chip.

4. The semiconductor package of claim 3, wherein the fourth region overlaps with at least one second semiconductor chip in the vertical direction.

5. The semiconductor package of claim 1, wherein the bonding pads form a single row parallel to the first edge.

6. The semiconductor package of claim 1, wherein the molding portion is formed of a material comprising an epoxy molding compound.

7. A semiconductor package, comprising:
a package substrate comprising an insulating layer and a connection pad on an upper surface of the package substrate, the insulating layer comprising openings;
an adhesive disposed on the insulating layer;
at least one first semiconductor chip disposed on the adhesive, and comprising a first surface facing the insulating layer and a second surface opposite the first surface in a vertical direction, and further comprising a first edge and a second edge opposite the first edge in a horizontal direction, wherein the first semiconductor chip comprises bonding pads disposed on the second surface along the first edge, and first and second corners disposed at opposite ends of the first edge and third and fourth corners disposed on opposite ends of the second edge and wire-bonded to the connection pad; and
at least one second semiconductor chip stacked on the second surface and offset in the horizontal direction to form a staircase pattern,
wherein the openings are disposed in a first region of the insulating layer, and wherein the insulating layer comprises a second region other than the first region, and
wherein the first and second corners overlap the second region in the vertical direction, and the third and fourth corners partially overlap the first region in the vertical direction, and
wherein a lower surface of the adhesive is in contact with an upper surface of the insulating layer and an upper service of the adhesive is in contact with a lower surface of a lowermost first semiconductor chip among the at least one first semiconductor chip.

8. The semiconductor package of claim 7, wherein at least one of the third and fourth corners of the first semiconductor chip comprises a warped region, wherein a portion of the first semiconductor chip is warped upwardly from the insulating layer in the warped region.

9. The semiconductor package of claim 8, wherein the warped region has a width equivalent to 1.25% or less of the length of the one edge of the first semiconductor chip.

10. The semiconductor package of claim 7, wherein the adhesive includes a die attach film.

11. The semiconductor package of claim 7, wherein the first semiconductor chip is a memory chip of the same type as the second semiconductor chip.

12. The semiconductor package of claim 7, wherein the insulating layer is a solder resist layer.

13. A semiconductor package, comprising:
a package substrate comprising one surface on which an insulating layer is disposed and a connection pad, the insulating layer comprising first and second openings;
an adhesive disposed on the insulating layer; and
at least one semiconductor chip stack comprising a plurality of semiconductor chips stacked on the one surface of the package substrate in the form of a staircase and wire-bonded to the connection pad,
wherein a plurality of the semiconductor chips comprises:
a first semiconductor chip comprising a tetragonal mounting region defined by first and second edges opposing each other and third and fourth edges connecting the first and second edges, wherein the first semiconductor chip comprises a plurality of bonding pads disposed adjacent to the first edge; and
at least one second semiconductor chip stacked on the first semiconductor chip in the form of a staircase,
wherein both ends of the second edge partially overlap the first and second openings in a vertical direction, and
wherein a molding portion covers the package substrate to encapsulate the semiconductor chip stack, and
wherein the molding portion fills the openings to partially contact an adhesion surface of the first semiconductor chip on an underside of the first semiconductor chip, and
wherein a lower surface of the adhesive is in contact with an upper surface of the insulating layer and an upper surface of the adhesive is in contact with a lower surface of a lowermost first semiconductor chip among the at least one first semiconductor chip.

14. The semiconductor package of claim 13, wherein the adhesion surface includes a die attach film.

15. The semiconductor package of claim 13, wherein the first and second openings have a same shape and are disposed symmetrically to the both ends of the second edge.

16. The semiconductor package of claim 13, wherein the first and second semiconductor chips are same-type memory chips.

17. The semiconductor package of claim 13, wherein the second semiconductor chip is stacked offset from the first semiconductor chip toward the second edge to form the staircase.

18. The semiconductor package of claim 13, wherein the package substrate A printed circuit hoard.

* * * * *